(12) United States Patent
Kimura

(10) Patent No.: US 6,516,015 B1
(45) Date of Patent: Feb. 4, 2003

(54) LASER DRIVER AND OPTICAL TRANSCEIVER

(75) Inventor: Hiroshi Kimura, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/442,772

(22) Filed: Nov. 18, 1999

(30) Foreign Application Priority Data

Nov. 19, 1998 (JP) ............................................. 10-329043

(51) Int. Cl.[7] .............................. H01S 3/00; H01S 3/13
(52) U.S. Cl. ............................... 372/38.02; 372/29.01; 372/29.011; 372/38
(58) Field of Search ......................... 372/29.01, 29.011, 372/38, 38.02

(56) References Cited

U.S. PATENT DOCUMENTS 5,796,767 A * 8/1998 Aizawa .................... 372/38.02
6,067,307 A * 5/2000 Krishnamoorthy ........... 372/26

FOREIGN PATENT DOCUMENTS

JP                09232635        5/1997

* cited by examiner

Primary Examiner—Paul Ip
Assistant Examiner—Cornelius H. Jackson
(74) Attorney, Agent, or Firm—McDermott, Will & Emery

(57) ABSTRACT

A laser driver including a current-output-controlling switch; output-current-generating transistor; current-to-voltage converting transistor; first and second current sources; and current path selector having an input terminal and first and second output terminals. Responsive to a control signal, the selector outputs current through one of these two output terminals. The output current of the second current source is supplied to the current path selector. The output current supplied from the current path selector through the second output terminal thereof and the output current of the first current source are input to the current-to-voltage converting transistor. The output voltage of the current-to-voltage converting transistor is applied between the gate and source of the output-current-generating transistor. Then, the current is output through the drain of the output-current-generating transistor and the current-output-controlling switch.

19 Claims, 12 Drawing Sheets

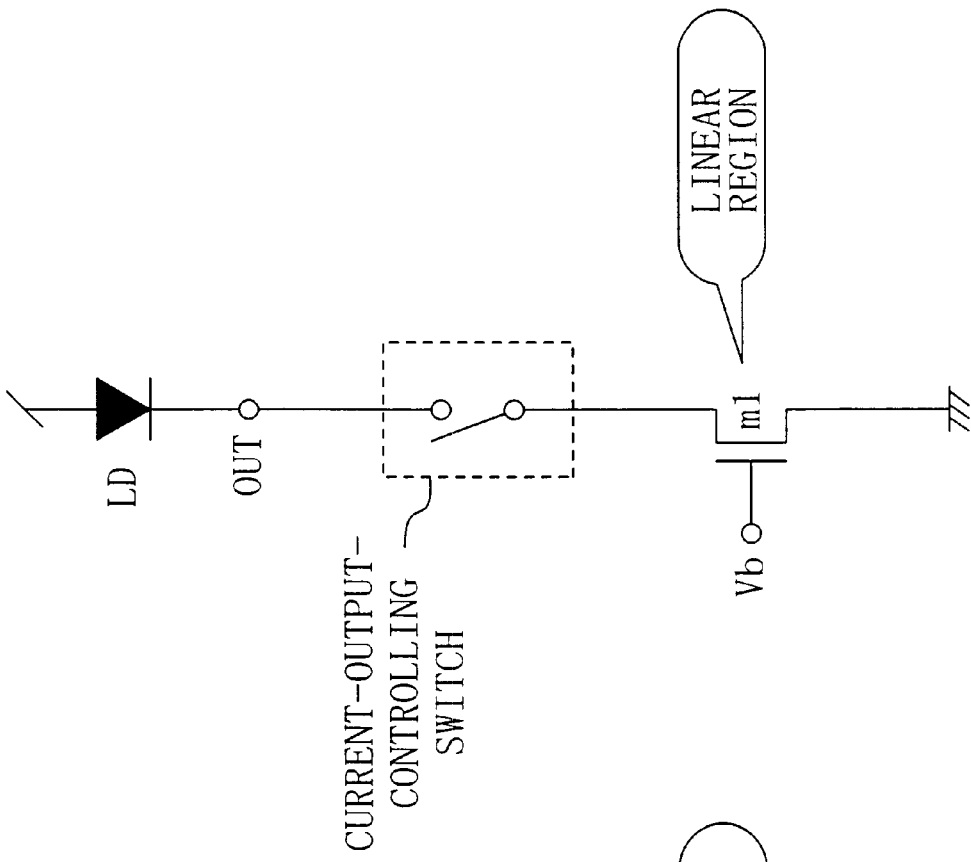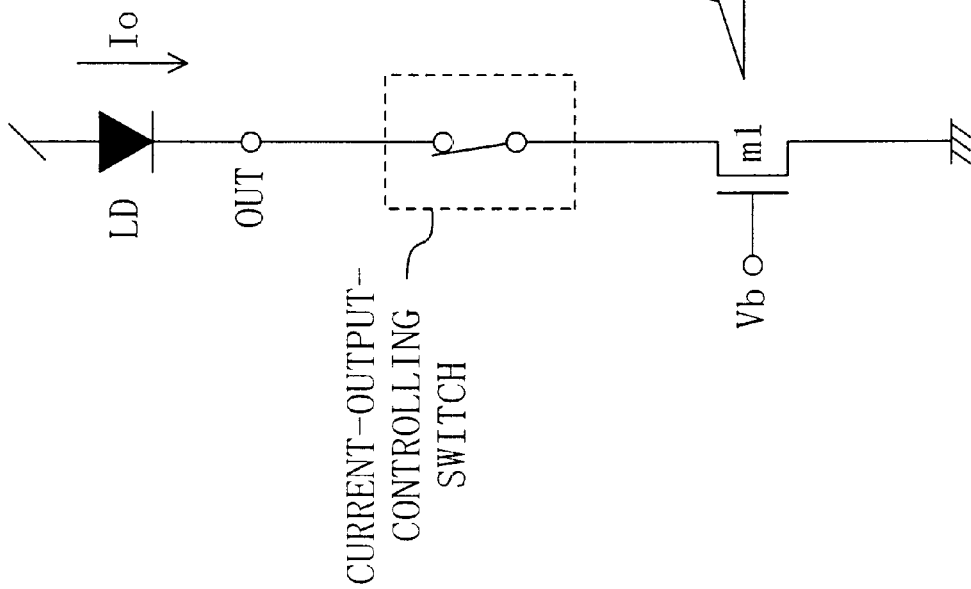

LASER DRIVER AND OPTICAL TRANSCEIVER

BACKGROUND OF THE INVENTION

The present invention generally relates to a laser driver for an optical signal transmitter in an optical communication system like a passive optical network (PON) system. More particularly, the present invention relates to a laser driver for selectively supplying output current from a laser-driving current output section by directly controlling the supply of the driving current from a driving-current-generating current source.

In recent years, optical subscriber systems are under vigorous research and development to set up a fiber-to-the-home (FTTH) communication network in the near future. However, it is economically difficult to introduce optical fibers into general home users. This is because an optical fiber has a gigantic transmission capacity, and is much more expensive than a conventional metallic communication line. Under the circumstances such as these, the PON system is expected to contribute much to the realization of the FTTH net-work considering the cost effectiveness thereof. The PON system can be less expensive, because a single optical fiber extended from a base station is branched to provide bidirectional communication service for a great number of subscribers.

A laser driver for use in an optical signal transmitter in an optical communication system selectively supplies laser-driving current responsive to a digital data signal received. A conventional laser driver has a differential configuration such as that illustrated in FIGS. 11(*a*) and 11(*b*). The laser driver with a differential configuration selectively supplies an output current by switching current paths of laser-driving current Io using a differential pair of transistors m2 and m3. In such a configuration, since constant current always flows through a power supply, small noise is generated and the switching speed of the laser driver is advantageously high. The laser driver of this type, however, is disadvantageous in that the power dissipation increases because the driving current continues to flow through a different path even in the output-disabled state as shown in FIG. 11(*b*).

To reduce the power dissipation, the output of the driving current may be controlled by turning ON/OFF a driving-current-generating current source transistor m1 itself as shown in FIG. 12 (see, for example, Japanese Laid-Open Publication No. 9-232635).

In such a configuration, however, the output is suspended by completely cutting off the current source transistor m1 with the gate of the transistor m1 short-circuited with the ground. Accordingly, to turn the transistor m1 ON, the gate voltage thereof should be raised by charging a large gate-source capacitance Cgs of the transistor m1 with current Is, thus causing a considerable time delay. In addition, since the time delay is variable with the current Is for charging the gate-source capacitance Cgs of the transistor m1, the delay also depends on the driving current Io after all. Furthermore, the output current shows a waveform with unsharp rising edges.

SUMMARY OF THE INVENTION

An object of the present invention is providing a laser driver that can output a current with an ideal waveform steeply rising responsive to a digital data signal without any overshoot by directly controlling the supply of the driving current from a driving-current-generating current source.

A laser driver according to the present invention includes output node, first power supply node, first switch, current generating means, current-to-voltage converting means and output-current-generating transistor. A driving current is output through the output node. A first supply voltage is applied to the first power supply node. The first switch is connected between the output node and the first power supply node. The current generating means generates a first current with a first current value while the first switch is OFF and a second current with a second current value, which is different from the first current value, while the first switch is ON. The current-to-voltage converting means converts the current supplied from the current generating means into a voltage corresponding to the current value thereof. And the output-current-generating transistor is connected between the first switch and the first power supply node and receives the voltage from the current-to-voltage converting means at the gate thereof.

In one embodiment of the present invention, the current generating means may include first and second current sources and a current path selector. The first current source supplies the first current to the current-to-voltage converting means. The second current source generates a third current with a current value representing a difference between the first and second current values. And the current path selector supplies the third current from the second current source to the current-to-voltage converting means only when the first switch is ON.

In the laser driver according to the present invention, even while the first switch is OFF (i.e., in the output-disabled state), the gate of the output-current-generating transistor is still biased with a voltage corresponding to the first current. Accordingly, when the first switch turns ON and the laser driver enters the output-enabled state, the laser driving output current rises steeply. Also, since the bias voltage applied to the gate of the output-current-generating transistor in the output-disabled state is lower than the bias voltage applied in the output-enabled state, an ideal output waveform without any overshoot can be obtained.

In this particular embodiment, the current path selector preferably includes input terminal, output terminal and second switch. The input terminal receives the third current from the second current source. The output terminal is connected to the current-to-voltage converting means. And the second switch is connected between the input and output terminals, turns ON when the first switch is ON and turns OFF when the first switch is OFF.

In the laser driver, while the first switch is OFF (i.e., in the output-disabled state), the supply of the third current from the second current source is suspended, thus reducing the power dissipation.

In another embodiment, the current generating means may include a current source and a current shunt circuit. The current source generates the second current. When the first switch is ON, the current shunt circuit supplies the second current from the current source to the current-to-voltage converting means. When the first switch is OFF, the current shunt circuit branches the second current into the first current and a third current with a current value representing a difference between the first and second current values and then supplies the first current to the current-to-voltage converting means.

In this particular embodiment, the current shunt circuit preferably includes input terminal, first and second output terminals and first and second transistors. The input terminal receives the second current from the current source. The first output terminal is connected to the first power supply node. The second output terminal is connected to the current-to-voltage converting means. The source and drain of the first transistor are connected to the input terminal and the first output terminal, respectively. The first transistor turns OFF when the first switch is ON, but makes the third current flow between the source and drain thereof when the first switch is OFF. The source and drain of the second transistor are connected to the input terminal and the second output terminal, respectively. The second transistor makes the second current flow between the source and drain thereof when the first switch is ON and makes the first current flow between the source and drain thereof when the first switch is OFF.

In the laser driver, even while the first switch is OFF (i.e., in the output-disabled state), the gate of the output-current-generating transistor is still biased with a voltage corresponding to the first current. Accordingly, when the first switch turns ON and the laser driver enters the output-enabled state, the laser driving output current rises steeply. Also, since the bias voltage applied to the gate of the output-current-generating transistor in the output-disabled state is lower than the bias voltage applied in the output-enabled state, an ideal output waveform without any overshoot can be obtained.

In still another embodiment, the current generating means may include first and second current sources. The first current source supplies the first current to the current-to-voltage converting means. The second current source supplies a third current with a current value representing a difference between the first and second current values to the current-to-voltage converting means only when the first switch is ON.

In the laser driver, while the first switch is OFF (i.e., in the output-disabled state), the second current source does not supply the third current, thus reducing the power dissipation.

In still another embodiment, the current generating means may include current source, current ratio regulator and current path selector. The current source generates the second current. The current ratio regulator branches the second current supplied from the current source into two currents with a desired current ratio and then supplies one of these two currents as the first current to the current-to-voltage converting means. The current path selector supplies the other one of the two currents that have been branched by the current ratio regulator to the current-to-voltage converting means only when the first switch is ON.

In this particular embodiment, the current ratio regulator preferably includes input terminal, first and second output terminals and first and second transistors. The input terminal receives the second current from the current source. The first output terminal is connected to the current path selector. The second output terminal is connected to the current-to-voltage converting means. The source and drain of the first transistor are connected to the input terminal and the first output terminal, respectively. The first transistor receives a first voltage at the gate thereof. The source and drain of the second transistor are connected to the input terminal and the second output terminal, respectively. The second transistor receives a second voltage at the gate thereof.

In the laser driver, the second current supplied from the current source can be branched into two currents at a desired current ratio by regulating the first and second voltages. Accordingly, the eye pattern of the optical output power can be optimized under any operating condition, thus realizing a laser driver with broadened applicability.

In still another embodiment, the current generating means may include current source, current ratio regulator, first and second current mirror circuits and current path selector. The current source generates the second current. The current ratio regulator branches the second current supplied from the current source into two currents at a desired current ratio. The first current mirror circuit receives one of the two currents branched by the current ratio regulator as an input current. The second current mirror circuit receives the other one of the two currents branched by the current ratio regulator as an input current and supplies an output current as the first current to the current-to-voltage converting means. The current path selector supplies the output current of the first current mirror circuit to the current-to-voltage converting means only when the first switch is ON.

In still another embodiment, the current ratio regulator preferably includes input terminal, first and second output terminals and first and second transistors. The input terminal receives the second current from the current source. The first output terminal is connected to the first current mirror circuit. The second output terminal is connected to the second current mirror circuit. The source and drain of the first transistor are connected to the input terminal and the first output terminal, respectively. The first transistor receives a first voltage at the gate thereof. The source and drain of the second transistor are connected to the input terminal and the second output terminal, respectively. The second transistor receives a second voltage at the gate thereof.

In the laser driver, the second current supplied from the current source can be branched into two currents at a desired current ratio by regulating the first and second voltages. Accordingly, the eye pattern of the optical output power can be optimized under any operating condition, thus realizing a laser driver with broadened applicability. In addition, since the number of cascaded transistors decreases, the laser driver can operate stably even at a lower voltage applied.

An optical transceiver according to the present invention is adapted to establish optical communication and includes a transmitter section and a receiver section. The transmitter section converts data to be transmitted into laser light by driving a laser diode and then transmits the laser light. The receiver section converts the laser light received into received data. The transmitter section includes the laser driver according to the present invention and drives the laser diode using the laser driver.

Another laser driver according to the present invention includes output node, first power supply node, gate-grounded transistor, switching transistor and output-current-generating transistor. A driving current is output through the output node. A first supply voltage is applied to the first power supply node. The gate-grounded transistor is connected between the output node and the first power supply node and receives a constant voltage at the gate thereof. The switching transistor is connected between the source of the gate-grounded transistor and the first power supply node in series to the gate-grounded transistor. The output-current-generating transistor is connected between the switching transistor and the first power supply node in series to the switching transistor. When the switching transistor is ON, the output-current-generating transistor receives a first voltage at the gate thereof. And when the switching transistor is OFF, the output-current-generating transistor receives a second voltage, which is different from the first voltage, at the gate thereof.

In the laser driver according to the present invention, even while the switching transistor is OFF (i.e., in the output-disabled state), the gate of the output-current-generating transistor is still biased with the second voltage. Accordingly, when the switching transistor turns ON and the laser driver enters the output-enabled state, the laser driving output current rises steeply. Also, since the bias voltage applied to the gate of the output-current-generating transistor in the output-disabled state is lower than the bias voltage applied in the output-enabled state, an ideal output waveform without any overshoot can be obtained.

BRIEF DESCRIPTION OF THE DRAWINGS

FIGS. 4(a) and 4(b) illustrate the effects attained by the laser driver according to the first embodiment.

DESCRIPTION OF THE PREFERRED EMBODIMENTS

Hereinafter, preferred embodiments of the present invention will be described with reference to the accompanying drawings.

EMBODIMENT 1

Figure 1:
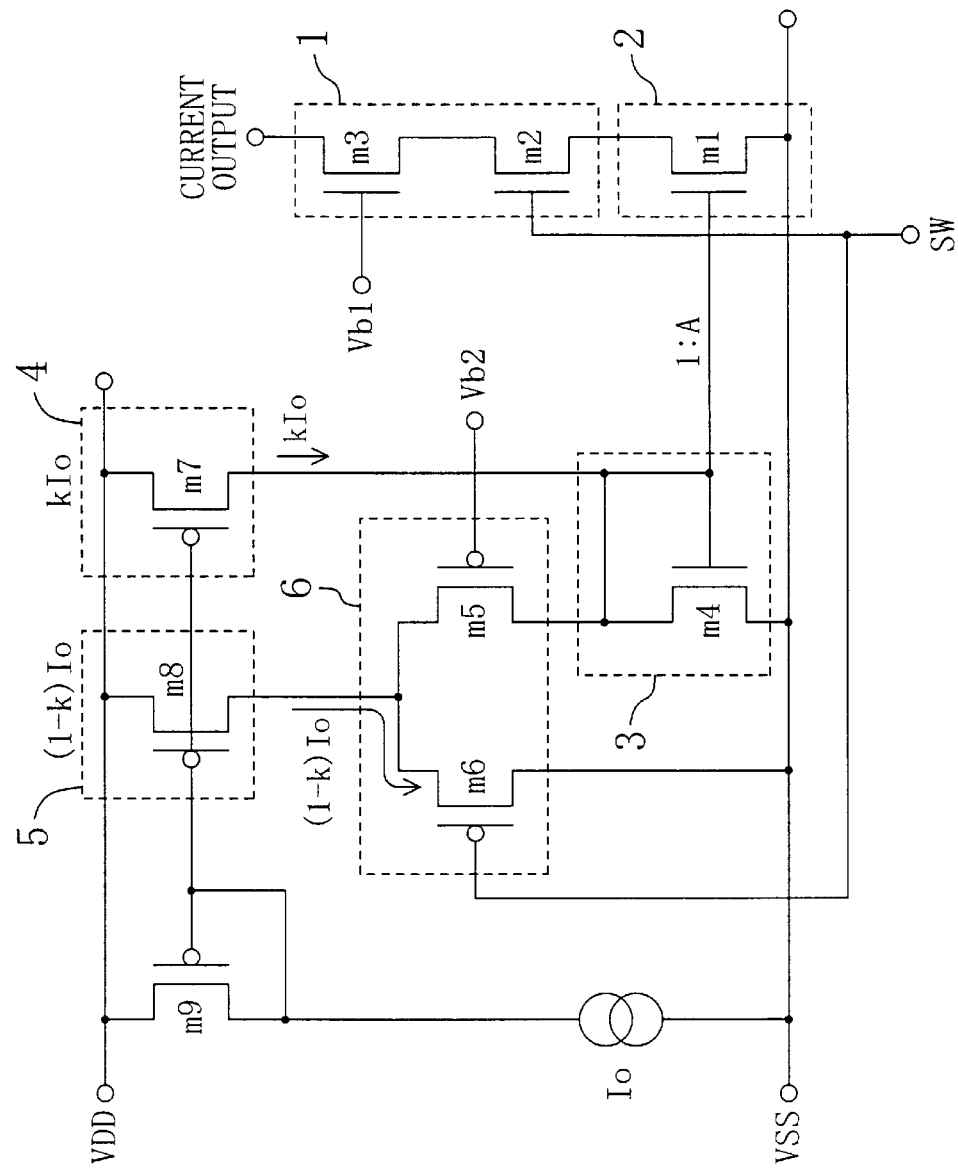
FIG. 1 illustrates a configuration of a laser driver according to a first embodiment of the present invention.

FIG. 1 illustrates a configuration of a laser driver according to a first embodiment of the present invention. As shown in FIG. 1, the laser driver includes: current-output-controlling switch 1; output-current-generating transistor 2 (or m1); transistor 3 (or m4) implemented as current-to-voltage converting means; first and second current sources 4, 5; and current path selector 6. The switch 1 is a cascade connection of a transistor m3 receiving a constant voltage Vb1 at its gate and a switching transistor m2 receiving a control signal SW at its gate. The gate of the transistor m4 is diode-connected to the drain thereof. The first and second current sources 4 and 5 are implemented as respective current source transistors m7 and m8 receiving a constant bias voltage at their gate. The current path selector 6 includes first and second transistors m6 and m5, the sources of which are connected together.

The source of the first current source transistor m7 is connected to a higher-level power supply VDD, while the drain thereof is connected to the drain and gate of the diode-connected NMOS transistor m4. The source of the second current source transistor m8 is also connected to the higher-level power supply VDD, while the drain thereof is connected to the input terminal of the current path selector 6, which is the commonly connected source of the PMOS transistors m5 and m6. The drain of the PMOS transistor m6, which is the first output terminal of the current path selector 6, is connected to a lower-level power supply VSS. On the other hand, the drain of the PMOS transistor m5, which is the second output terminal of the current path selector 6, is connected to the gate and drain of the NMOS transistor m4. The source of the NMOS transistor m4 is connected to the lower-level power supply VSS. The source of the NMOS transistor m1 is connected to the lower-level power supply VSS, the gate thereof is connected to the gate and drain of the NMOS transistor m4 and the drain thereof is connected to the source of the switching NMOS transistor m2. The drain of the NMOS transistor m2 is connected to the source of the NMOS transistor m3. A laser driving output current is supplied through the drain of the NMOS transistor m3.

In the illustrated embodiment, the current values of the first and second current sources 4 and 5 will be identified by kIo and (1−k)Io (where $0 \leq k \leq 1$) and the mirror ratio of a current mirror circuit made up of the NMOS transistors m4 and m1 will be represented as 1:A. The control signal SW is also provided to the gate of the PMOS transistor m6. A predetermined bias voltage Vb2 is applied to the gate of the PMOS transistor m5 so as to cut off the transistor m5 when the control signal SW is at "Low" level and the transistor m6 when the control signal SW is at "High" level.

Hereinafter, it will be described how this laser driver operates.

First, while the control signal SW is at "Low" level, the switching NMOS transistor m2 is OFF and the laser driver enters the output-disabled state. In this case, the output current (1−k)Io of the second current source 5 flows through the transistor m6. Thus, only the output current kIo of the first current source 4 is supplied to the NMOS transistor m4, which in turn converts the current supplied into a voltage. As a result, the gate of the output-current-generating NMOS transistor m1 is biased with the voltage.

Next, when the control signal SW rises to "High" level, the switching NMOS transistor m2 turns ON and the laser driver enters the output-enabled state. As a result, the laser driving output current rises steeply. This is because the gate of the NMOS transistor m1 is always biased even in the output-disabled state. In such a situation, the PMOS transistor m6 is cut off and the output current (1−k)Io of the second current source 5 is also supplied to the drain of the NMOS transistor m4. Accordingly, the total amount of current supplied to the drain of the NMOS transistor m4 gets equal to Io. As a result, the gate voltage of the NMOS transistor m1 steeply increases and the transistor m1 can rapidly transition from a linear to saturated region.

In this manner, the laser driving output current AIo shows an ideal waveform without any overshoot although the waveform has steeply rising edges.

In the foregoing embodiment, the constant voltage Vb2 is applied to the gate of the transistor m5 and the control signal SW is provided to the gate of the transistor m6. Alternatively, a complementary voltage of the control signal SW may be applied to the gate of the transistor m5.

Figure 2A:
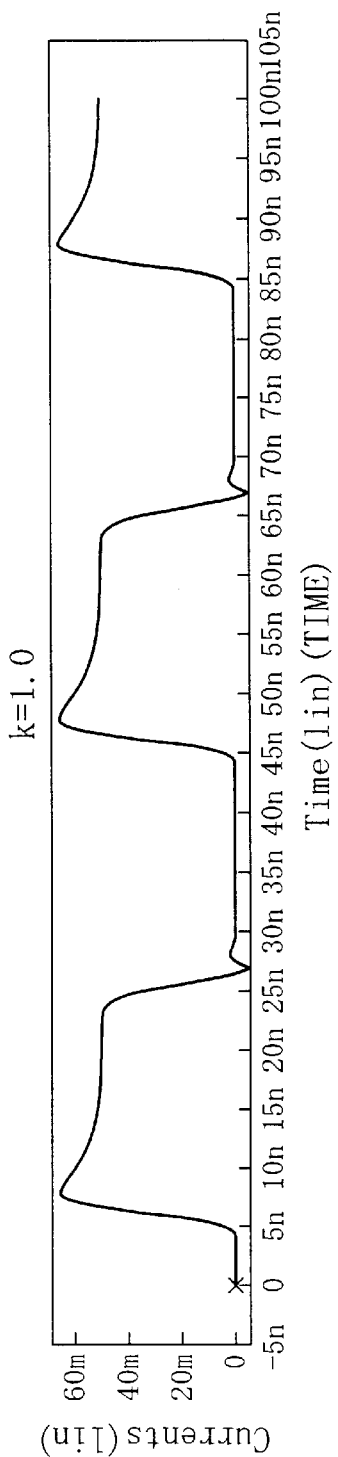
FIG. 2(a) illustrates a result of simulation where k=1.0.
Figure 2B:
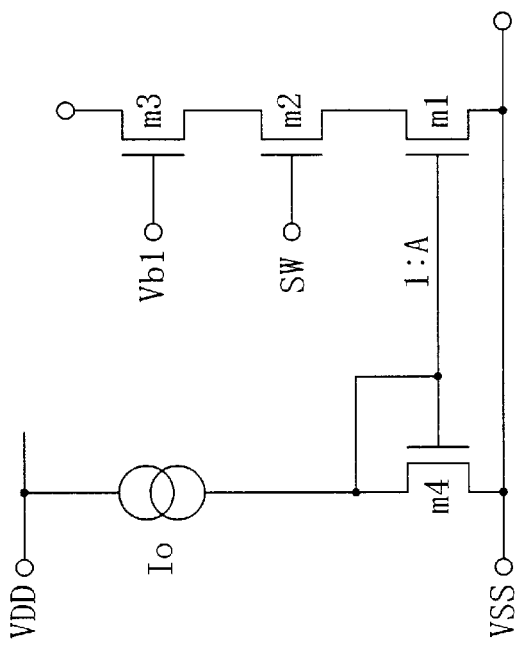
FIG. 2(b) illustrates an equivalent circuit where k=1.0.

FIG. 2(a) illustrates a result of simulation where k=1.0. In this case, no matter whether the current-output-controlling switch is ON or OFF, a constant current Io is always supplied to the diode-connected transistor m4 as can be seen from the equivalent circuit shown in FIG. 2(b). Accordingly, considerable overshoot is observed at each rising edge as shown in FIG. 2(a).

Figure 3A:
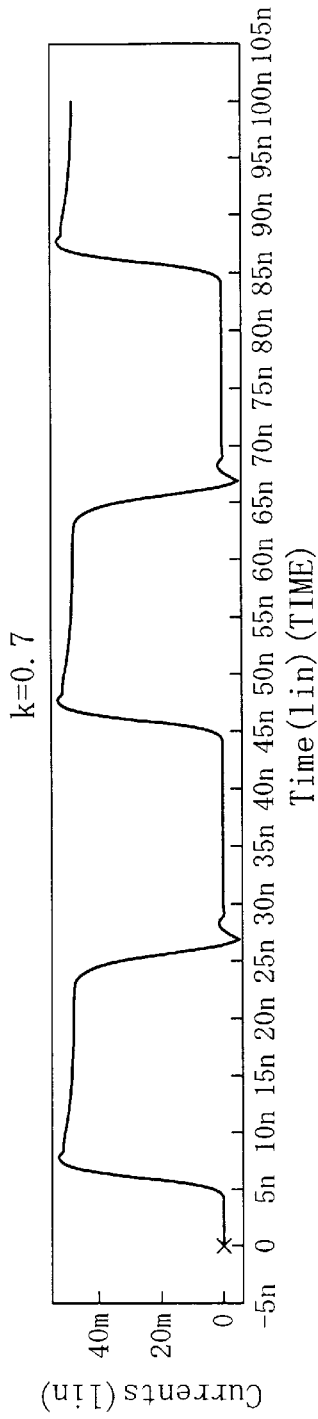
FIGS. 3(a), 3(b) and 3(c) illustrate results of simulations where k=0.7, 0.5 and 0.3, respectively.
Figure 3B:
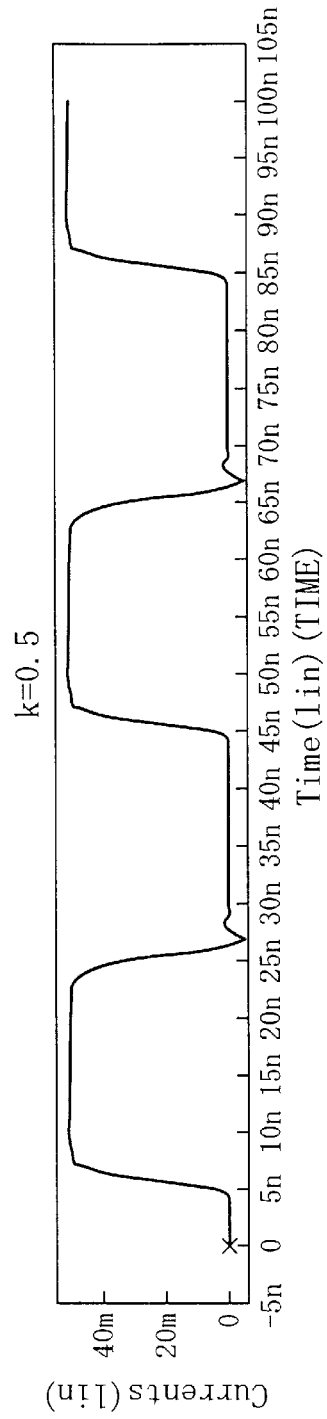
Figure 3C:
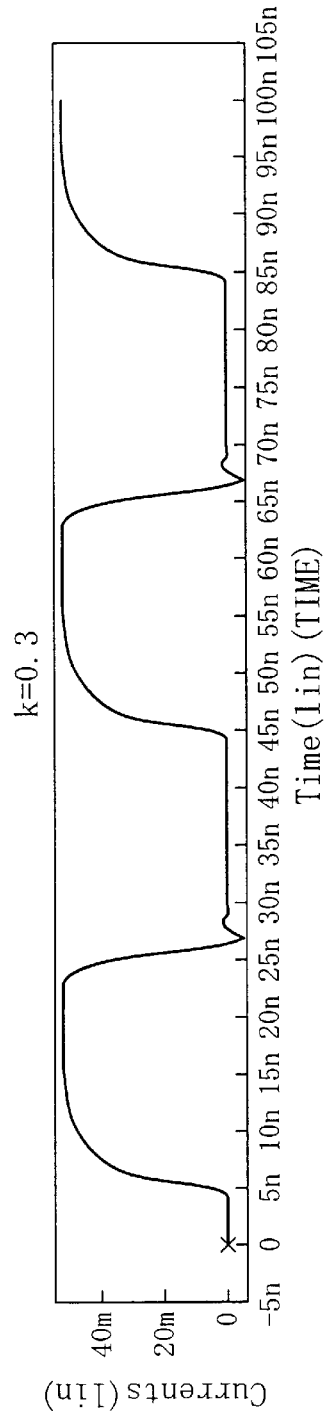

FIGS. 3(a), 3(b) and 3(c) illustrate results of simulations where k=0.7, 0.5 and 0.3, respectively. As can be seen from these drawings, portions of the output waveform at rising edges are controllable by adjusting the value of k with the output current value kept constant. This k value can be easily preset at a desired value by changing the sizes of the first and second current source transistors m7 and m8. Also, as shown in FIG. 3(b), an ideal waveform without any overshoot or rounding can be obtained when k=0.5.

Thus, according to the first embodiment, a laser driving output current can show an ideal waveform with steeply rising edges and without any overshoot.

If just the steeply rising output current is required, then the bias voltage Vb may be applied to the gate of the driving-current-generating current source transistor m1 even in the output-disabled state as shown in FIG. 4(b). In such a case, the output current may be selectively supplied by turning ON/OFF a switch connected to the drain of the transistor m1. In this alternate embodiment, however, the current source transistor m1 enters a deep linear region in the output-disabled state. Thus, when the switch is turned ON and the laser driver enters the output-enabled state, considerable overshoot will be observed at the rising edge of the output current. This in why the laser driver according to the first embodiment adopts the configuration illustrated in FIG. 1.

EMBODIMENT 2

Figure 5:
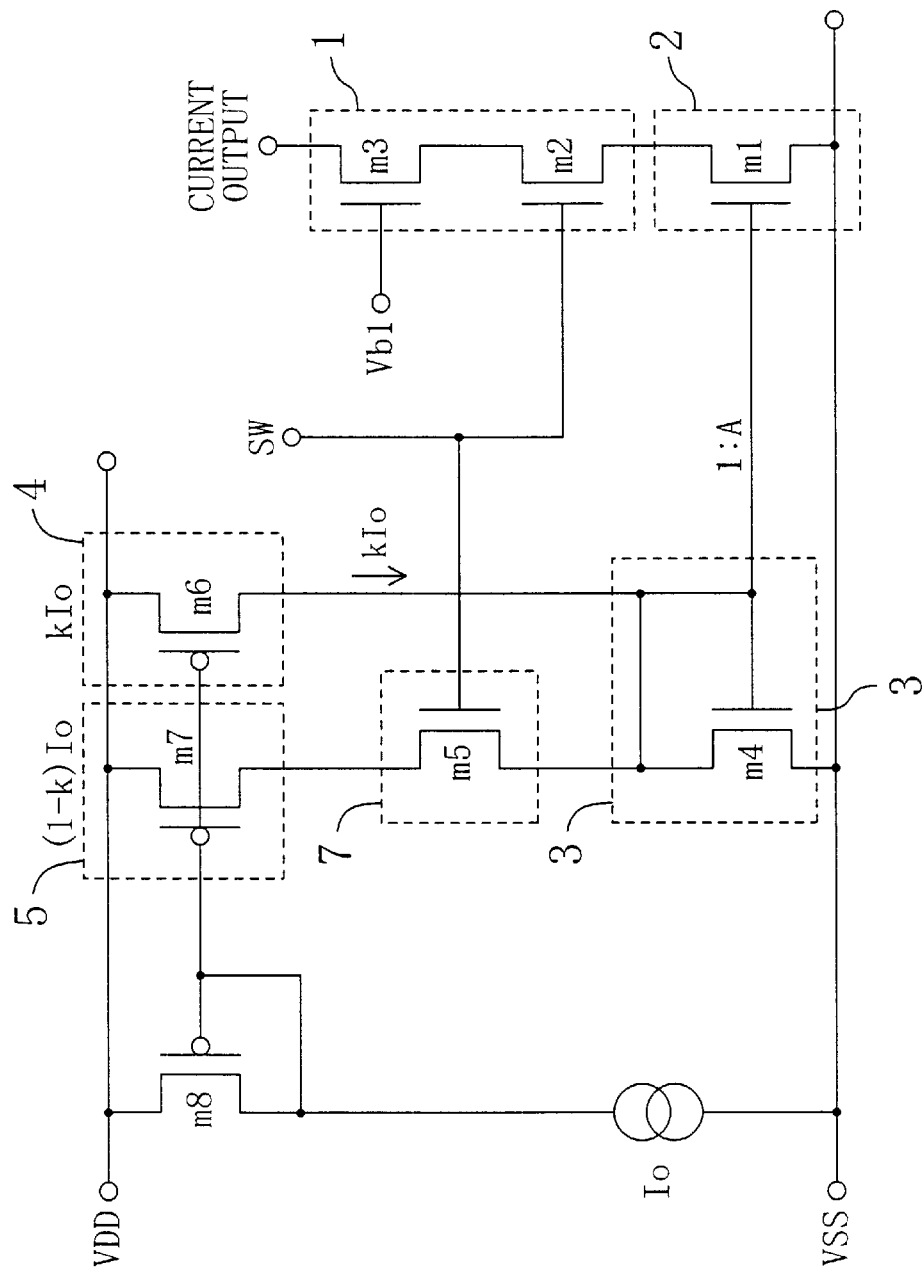
FIGS. 5, 6, 7, 8 and 9 illustrate respective configurations of a laser driver according to second, third, fourth, fifth and sixth embodiments of the present invention.

FIG. 5 illustrates a configuration of a laser driver according to a second embodiment of the present invention. As shown in FIG. 5, the laser driver includes: current-output-controlling switch 1; output-current-generating transistor 2 (or m1); transistor 3 (or m4) implemented as current-to-voltage converting means; first and second current sources 4, 5; and second switch 7. The switch 1 is a cascade connection of a transistor m3 receiving a constant voltage Vb1 at its gate and a switching transistor m2 receiving a control signal SW at its gate. The gate of the transistor m4 is diode-connected to the drain thereof. The first and second current sources 4 and 5 are implemented as current source transistors m6 and m7 receiving a constant bias voltage at their gate. The second switch 7 is implemented as a transistor m5 receiving the control signal SW at its gate.

The source of the PMOS transistor m6 is connected to a higher-level power supply VDD, while the drain thereof is connected to the drain and gate of the diode-connected NMOS transistor m4. The source of the PMOS transistor m7 is also connected to the higher-level power supply VDD, while the drain thereof is connected to the gate and drain of the NMOS transistor m4 via the NMOS transistor m5. The source of the NMOS transistor m1 is connected to a lower-level power supply VSS, the gate thereof is connected to the gate and drain of the NMOS transistor m4 and the drain thereof is connected to the source of the switching NMOS transistor m2. The drain of the NMOS transistor m2 is connected to the source of the NMOS transistor m3. A laser driving output current is supplied through the drain of the NMOS transistor m3.

In the illustrated embodiment, the current values of the first and second current sources 4 and 5 will be identified by kIo and (1−k)Io (where 0≦k≦1) and the mirror ratio of a current mirror circuit made up of the NMOS transistors m4 and m1 will be represented as 1:A.

Hereinafter, it will be described how this laser driver operates.

First, while the control signal SW is at "Low" level, the switching NMOS transistor m2 is OFF and the laser driver enters the output-disabled state. In this case, the transistor m5 is also OFF. Thus, only the output current kIo of the first current source 4 (i.e., the PMOS transistor m6) is supplied to the NMOS transistor m4, which in turn converts the current supplied into a voltage. As a result, the gate of the output-current-generating NMOS transistor m1 is biased with the voltage.

Next, when the control signal SW rises to "High" level, the switching NMOS transistor m2 turns ON and the laser driver enters the output-enabled state. As a result, the laser driving output current rises steeply. This is because the gate of the NMOS transistor m1 is always biased even in the output-disabled state. In this situation, the NMOS transistor m5 also turns ON and the output current (1−k)Io of the second current source 5 is also supplied to the transistor m4. Accordingly, the total amount of current supplied to the drain of the NMOS transistor m4 gets equal to Io. As a result, the gate voltage of the NMOS transistor m1 steeply increases and the transistor m1 can rapidly transition from a linear to saturated region.

In this manner, the laser driving output current AIo shows an ideal output waveform without any overshoot although the waveform has steeply rising edges.

In addition, since the current (1−k)Io of the second current source 5 is not supplied in the output-disabled state, the power dissipation can be reduced.

EMBODIMENT 3

Figure 6:
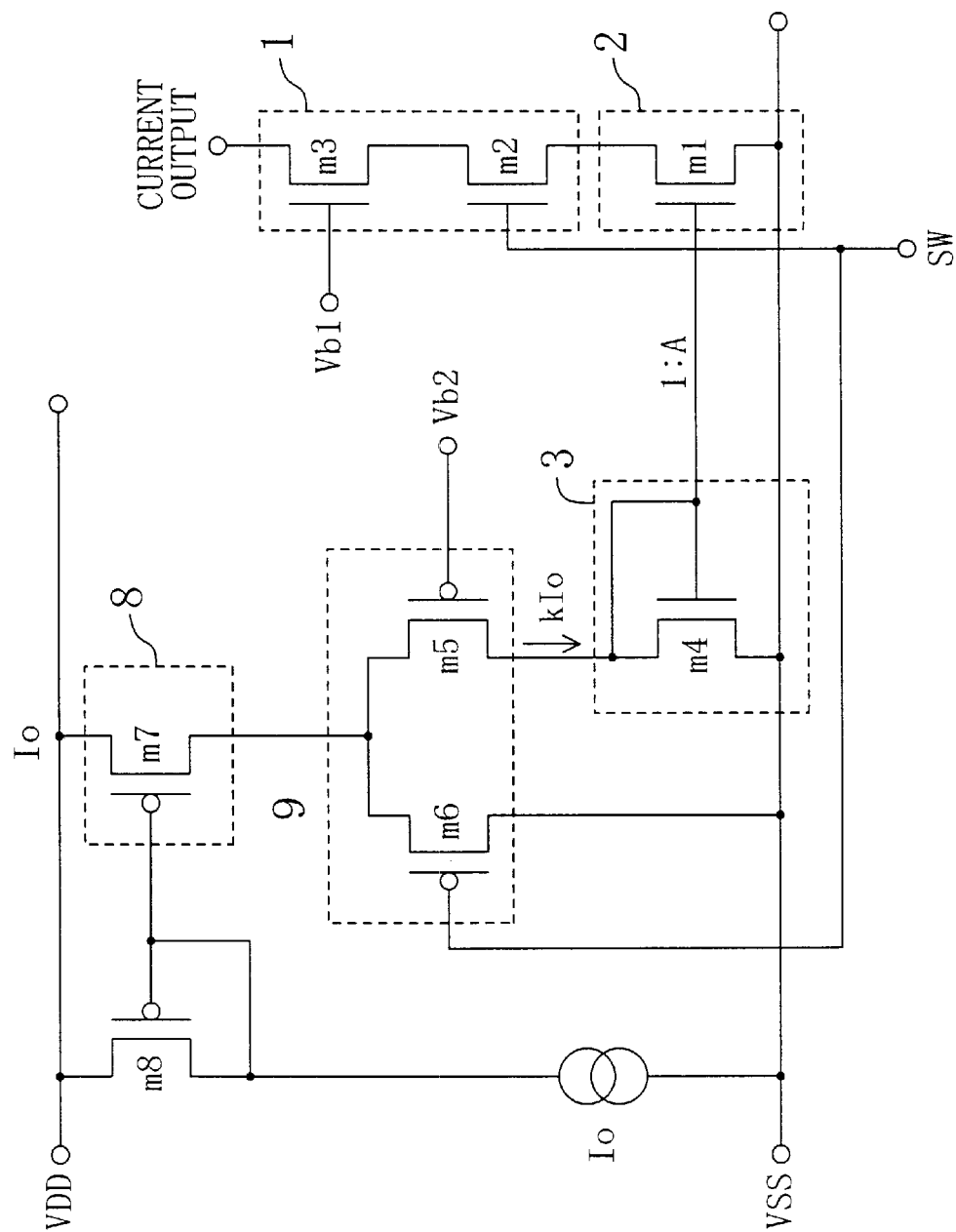

FIG. 6 illustrates a configuration of a laser driver according to a third embodiment of the present invention. As shown in FIG. 6, the laser driver includes: current-output-controlling switch 1; output-current-generating transistor 2 (or m1); transistor 3 (or m4) implemented as current-to-voltage converting means; current source 8; and current shunt circuit 9. The switch 1 is a cascade connection of a transistor m3 receiving a constant voltage Vb1 at its gate and a switching transistor m2 receiving a control signal SW at its gate. The gate of the transistor m4 is diode-connected to the drain thereof. The current source 8 is implemented as a transistor m7 receiving a constant bias voltage at its gate. The current shunt circuit 9 includes first and second transistors m6 and m5, the sources of which are connected together.

The source of the current source transistor m7 is connected to a higher-level power supply VDD, while the drain thereof is connected to the input terminal of the current shunt circuit 9, which is the commonly connected source of the PMOS transistors m5 and m6. The drain of the PMOS transistor m6, which is the first output terminal of the current shunt circuit 9, is connected to a lower-level power supply VSS. The drain of the PMOS transistor m8, which is the second output terminal of the current shunt circuit 9, is connected to the gate and drain of the NMOS transistor m4. The source of the NMOS transistor m4 is connected to the lower-level power supply VSS. The source of the NMOS transistor m1 is also connected to the lower-level power supply VSS, the gate thereof is connected to the gate and drain of the NMOS transistor m4 and the drain thereof is connected to the source of the switching NMOS transistor m2. The drain of the NMOS transistor m2 is connected to the source of the NMOS transistor m3. A laser driving output current is supplied through the drain of the NMOS transistor m3.

In the illustrated embodiment, the current value of the current source 8 will be identified by Io and the mirror ratio of a current mirror circuit made up of the NMOS transistors m4 and m1 will be represented as 1:A. The control signal SW is also provided to the gate of the PMOS transistor m6. A predetermined bias voltage vb2 is applied to the gate of the PMOS transistor m5 such that the drain currents of the transistors m5 and m6 are kIo and (1−k)Io (where $0 \leq k \leq 1$) when the control signal SW is at "Low" level and that the transistor m6 is cut off and the drain current of the transistor m5 is Io when the control signal SW is at "High" level.

Hereinafter, it will be described how this laser driver operates.

First, while the control signal SW is at "Low" level, the switching NMOS transistor m2 is OFF and the laser driver enters the output-disabled state. In this case, the current kIo flows through the transistor m5 and is supplied to the NMOS transistor m4, which in turn converts the current supplied into a voltage. As a result, the gate of the output-current-generating NMOS transistor m1 is biased with the voltage.

Next, when the control signal SW rises to "High" level, the switching NMOS transistor m2 turns ON and the laser driver enters the output-enabled state. As a result, the laser driving output current rises steeply. This is because the gate of the NMOS transistor m1 is always biased even in the output-disabled state. In this situation, the PMOS transistor m6 is cut off and all the output current Io of the current source 8 is supplied to the drain of the NMOS transistor m4. That is to say, the total amount of current supplied to the drain of the NMOS transistor m4 gets equal to Io. As a result, the gate voltage of the NMOS transistor m1 steeply increases and the transistor m1 can rapidly transition from a linear to saturated region.

In this manner, the laser driving output current AIo shows an ideal waveform without any overshoot although the waveform has steeply rising edges.

EMBODIMENT 4

Figure 7:
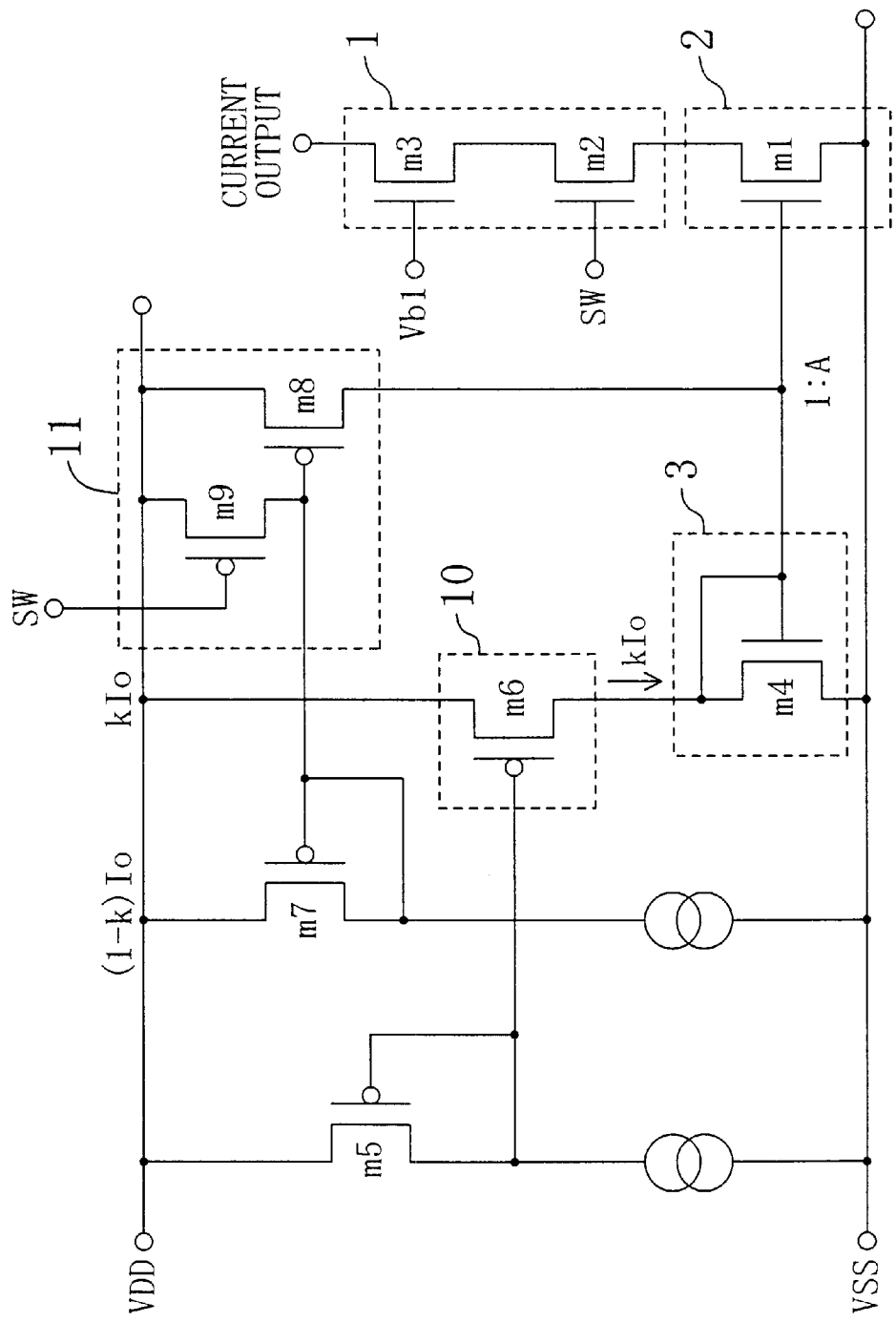

FIG. 7 illustrates a configuration of a laser driver according to a fourth embodiment of the present invention. As shown in FIG. 7, the laser driver includes: current-output-controlling switch 1; output-current-generating transistor 2 (or m1); transistor 3 (or m4) implemented as current-to-voltage converting means; and first and second current sources 10, 11. The switch 1 is a cascade connection of a transistor m3 receiving a constant voltage Vb1 at its gate and a switching transistor m2 receiving a control signal SW at its gate. The gate of the transistor m4 is diode-connected to the drain thereof. The first current source 10 is implemented as a transistor m6 receiving a constant bias voltage at its gate. The second current source 11 includes a current source transistor m8 and a control transistor m9 for turning ON/OFF the transistor m8.

The source of the PMOS transistor m6 is connected to a higher-level power supply VDD, while the drain thereof is connected to the drain and gate of the diode-connected NMOS transistor m4. The source of the PMOS transistor m8 is also connected to the higher-level power supply VDD, while the drain thereof is connected to the gate and drain of the NMOS transistor m4. The source of the NMOS transistor m4 is connected to a lower-level power supply VSS. The control signal SW is provided to the gate of the control transistor m9. The source of the transistor m9 is also connected to the higher-level power supply VDD, while the drain thereof is connected to the gate of the current source transistor m8. The source of the NMOS transistor m1 is connected to the lower-level power supply VSS, the gate thereof is connected to the gate and drain of the NMOS transistor m4 and the drain thereof is connected to the source of the switching NMOS transistor m2. The drain of the NMOS transistor m2 is connected to the source of the NMOS transistor m3. A laser driving output current is supplied through the drain of the NMOS transistor m3.

In the illustrated embodiment, the current values of the first and second current sources 10 and 11 will be identified by kIo and (1−k)Io (where $0 \leq k \leq 1$) and the mirror ratio of a current mirror circuit made up of the NMOS transistors m4 and m1 will be represented as 1:A.

Hereinafter, it will be described how this laser driver operates.

First, while the control signal SW is at "Low" level, the switching NMOS transistor m2 is OFF and the laser driver enters the output-disabled state. In this case, the current source transistor m8 is cut off by the control transistor m9. Thus, only the output current kIo of the PMOS transistor m6 is supplied to the diode-connected NMOS transistor m4, which in turn converts the current supplied into a voltage. As a result, the gate of the output-current-generating NMOS transistor m1 is biased with the voltage.

Next, when the control signal SW rises to "High" level, the switching NMOS transistor m2 turns ON and the laser driver enters the output-enabled state. As a result, the laser driving output current rises steeply. This is because the gate of the NMOS transistor m1 is always biased even in the output-disabled state. In this situation, the control transistor m9 turns OFF, the current source transistor m8 turns ON and the output current (1−k)Io is also supplied to the NMOS transistor m4. Accordingly, the total amount of current supplied to the drain of the NMOS transistor m4 gets equal to Io. As a result, the gate voltage of the NMOS transistor m1 steeply increases and the transistor m1 can rapidly transition from a linear to saturated region.

In this manner, the laser driving output current AIo shows an ideal output waveform without any overshoot although the waveform has steeply rising edges.

In addition, since the output current (1−k)Io of the second current source is not supplied in the output-disabled state, the power dissipation can be reduced.

EMBODIMENT 5

In the foregoing first through fourth embodiments, the current ratio k of the first and second current sources depends on the transistor sizes of the current sources and therefore is fixed at a chip design phase. The eye pattern of the optical output power, however, is greatly dependent on parasitic elements of a carrier board or package and on the current value Io. Thus, an optimum current ratio k cannot be defined at a unique value. The following fifth embodiment of the present invention is adapted to solve this problem.

Figure 8:
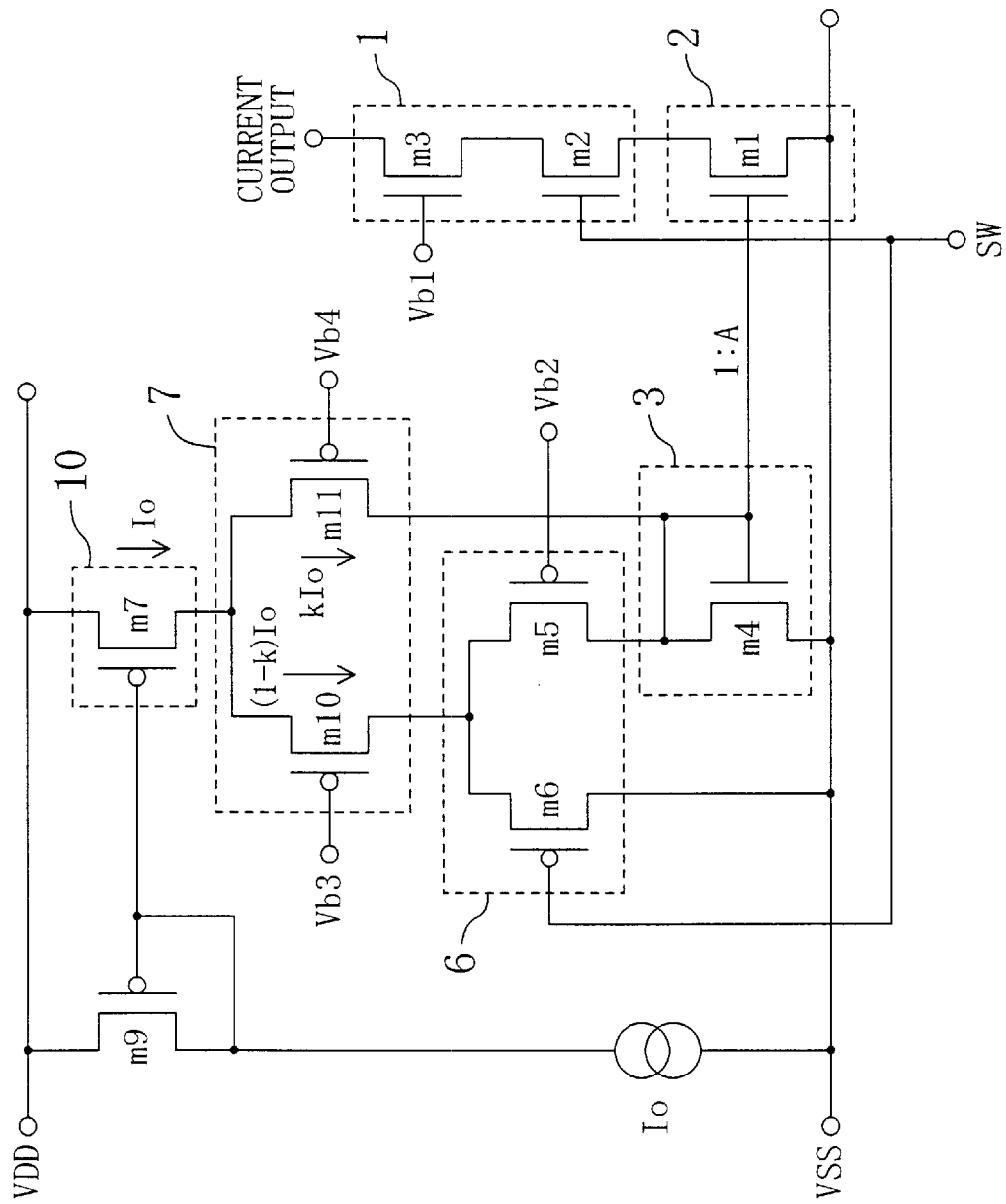

FIG. 8 illustrates a configuration of a laser driver according to the fifth embodiment of the present invention. As shown in FIG. 8, the laser driver includes: current-output-controlling switch 1; output-current-generating transistor 2 (or m1); transistor 3 (or m4) implemented as current-to-voltage converting means; current source 10; current ratio regulator 7; and current path selector 6. The switch 1 is a cascade connection of a transistor m3 receiving a constant voltage Vb1 at its gate and a switching transistor m2 receiving a control signal SW at its gate. The gate of the transistor m4 is diode-connected to the drain thereof. The current source 10 is implemented as a transistor m7 receiving a constant bias voltage at its gate. The current ratio regulator 7 includes first and second transistors m10 and m11, the sources of which are connected together. The current path selector 6 also includes a pair of transistors m6 and m5, the sources of which are connected together, too.

The source of the current source transistor m7 is connected to a higher-level power supply VDD, while the drain thereof is connected to the input terminal of the current ratio regulator 7, which is the commonly connected source of the PMOS transistors m10 and m11. The drain of the PMOS transistor m10, which is the first output terminal of the current ratio regulator 7, is connected to the input terminal of the current path selector 6, which is the commonly connected source of the PMOS transistors m6 and m5. The drain of the PMOS transistor m11, which is the second output terminal of the current ratio regulator 7, is connected to the gate and drain of the NMOS transistor m4. The drain of the PMOS transistor m6, which is the first output terminal of the current path selector 6, is connected to a lower-level power supply VSS. The drain of the PMOS transistor m5, which is the second output terminal of the current path selector 6, is connected to the gate and drain of the NMOS transistor m4. The source of the NMOS transistor m4 is connected to the lower-level power supply VSS. The source of the NMOS transistor m1 is connected to the lower-level power supply VSS, the gate thereof is connected to the gate and drain of the NMOS transistor m4 and the drain thereof is connected to the source of the switching NMOS transistor m2. The drain of the NMOS transistor m2 is connected to the source of the NMOS transistor m3. A laser driving output current is supplied through the drain of the NMOS transistor m3.

In the illustrated embodiment, the current value of the current source 10 will be identified by Io and the mirror ratio of a current mirror circuit made up of the NMOS transistors m4 and m1 will be represented as 1:A. Voltages Vb3 and Vb4 are applied to the gates of the PMOS transistors m10 and m11, respectively.

Hereinafter, it will be described how this laser driver operates.

The current Io is supplied from the current source 10 to the input terminal of the current ratio regulator 7 and then branched into two currents with respective values of kIo and (1−k)Io. The shunt ratio k is determined depending on the voltages Vb3 and Vb4 applied to the gates of the PMOS transistors m10 and m11, respectively. Stated otherwise, the shunt ratio k can be adjusted to a desired value by regulating the voltages Vb3 and Vb4.

First, while the control signal SW is at "Low" level, the switching NMOS transistor m2 is OFF and the laser driver enters the output-disabled state. In the current path selector 6, the transistor m6 turns ON, but the transistor m5 turns OFF. Accordingly, the current (1−k)Io, which flows through the transistor m10 of the current ratio regulator 7, passes through the transistor m6. On the other hand, the current kIo, which flows through the transistor m11 of the current ratio regulator 7, is supplied to the NMOS transistor m4. The total amount of current supplied to the NMOS transistor m4 is equal to kIo. Then, the NMOS transistor m4 converts the current supplied into a voltage. As a result, the gate of the output-current-generating NMOS transistor m1 is biased with the voltage.

Next, when the control signal SW rises to "High" level, the switching NMOS transistor m2 turns ON and the laser driver enters the output-enabled state. As a result, the laser driving output current rises steeply. This is because the gate of the NMOS transistor m1 is always biased even in the output-disabled state. In this situation, the PMOS transistor m6 is cut off and the current (1−k)Io, which flows through the transistor m10 of the current ratio regulator 7, is supplied to the transistor m5. Accordingly, the total amount of current supplied to the drain of the NMOS transistor m4 gets equal to Io. As a result, the gate voltage of the NMOS transistor m1 steeply increases and the transistor m1 can rapidly transition from a linear to saturated region.

As can be seen, by regulating the voltages Vb3 and Vb4 applied to the gates of the PMOS transistors m10 and m11 of the current ratio regulator 7, the current ratio k is easily controllable according to the fifth embodiment. Therefore, the current ratio k can be controlled in such a manner as to optimize the eye pattern of the optical output power under any operating condition, thus realizing a laser driver with broadened applicability.

EMBODIMENT 6

Figure 9:
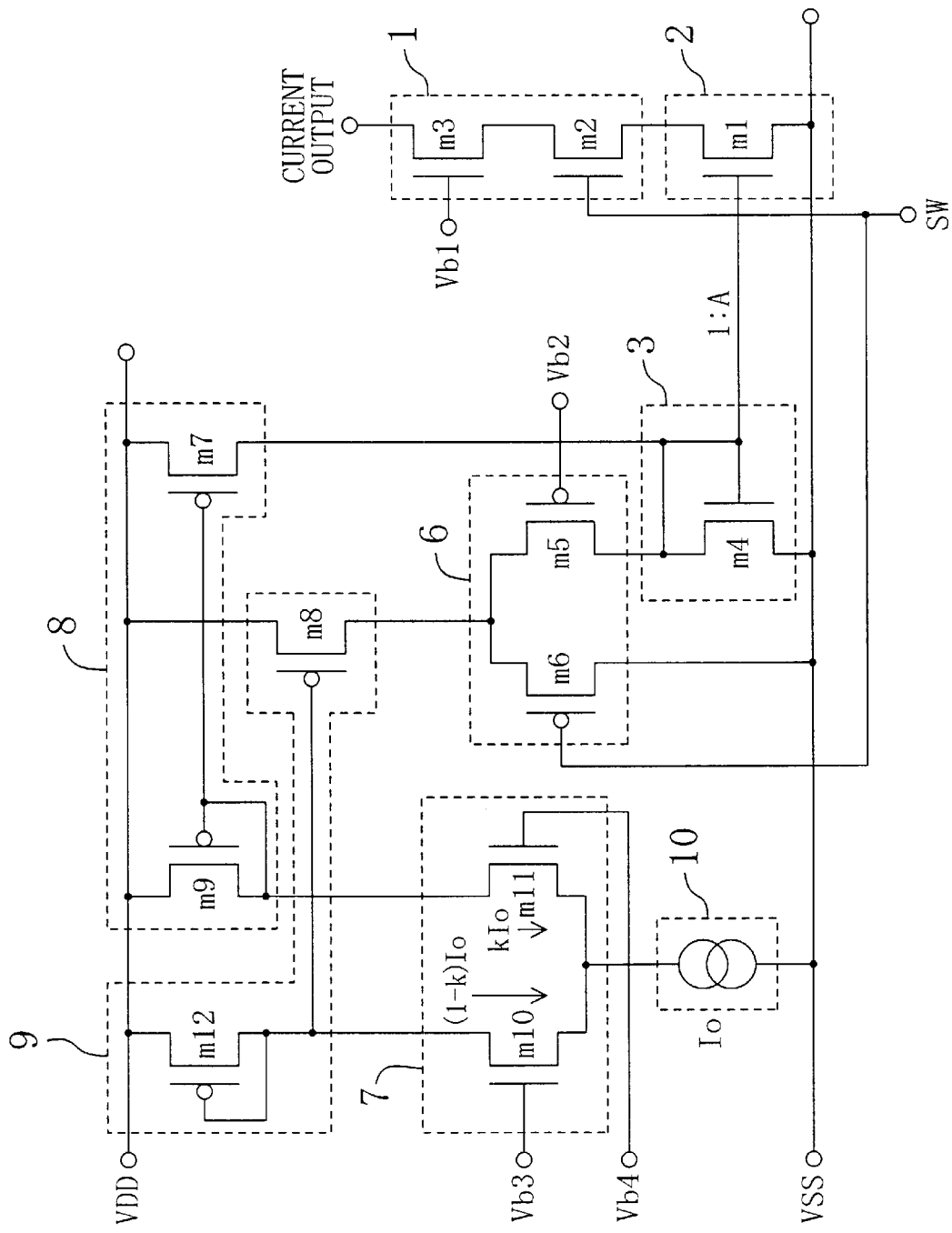

FIG. 9 illustrates a configuration of a laser driver according to a sixth embodiment of the present invention. As shown in FIG. 9, the laser driver includes: current-output-controlling switch 1; output-current-generating transistor 2 (or m1); transistor 3 (or m4) implemented as current-to-voltage converting means; current source 10; current ratio regulator 7; current path selector 6; and first and second current mirror circuits 9 and 8. The switch 1 is a cascade connection of a transistor m3 receiving a constant voltage Vb1 at its gate and a switching transistor m2 receiving a control signal SW at its gate. The gate of the transistor m4 is diode-connected to the drain thereof. The current ratio regulator 7 includes first and second transistors m10 and m11, the sources of which are connected together. The current path selector 6 also includes a pair of transistors m6 and m5, the sources of which are connected together, too. The first current mirror circuit 9 is made up of a pair of transistors m12 and m8, while the second current mirror circuit 8 is made up of another pair of transistors m9 and m7.

The current source 10 is connected between a lower-level power supply VSS and the input terminal of the current ratio regulator 7, which is the commonly connected source of the NMOS transistors m10 and m11. The drain of the NMOS transistor m10, which is the first output terminal of the current ratio regulator 7, is connected to the drain and gate of the diode-connected PMOS transistor m12 in the first current mirror circuit 9. The drain of the NMOS transistor m11, which is the second output terminal of the current ratio regulator 7, is connected to the drain and gate of the diode-connected PMOS transistor m9 in the second current mirror circuit 8. In the first current mirror circuit 9, the source of the PMOS transistor m8 is connected to a higher-level power supply VDD. The drain of the transistor m8 is connected to the input terminal of the current path selector 6, which is the commonly connected source of the PMOS transistors m5 and m6. And the gate of the transistor m8 is connected to the drain and gate of the PMOS transistor m12. In the second current mirror circuit 8, the source of the PMOS transistor m7 is connected to the higher-level power supply VDD. The drain of the transistor m7 is connected to the drain and gate of the NMOS transistor m4. And the gate of the transistor m7 is connected to the drain and gate of the PMOS transistor m9. The drain of the PMOS transistor m6, which is the first output terminal of the current path selector 6, is connected to a lower-level power supply VSS. The drain of the PMOS transistor m5, which is the second output terminal of the current path selector 6, is connected to the drain and gate of the NMOS transistor m4. The source of the NMOS transistor m4 is connected to the lower-level power supply VSS. The source of the NMOS transistor m1 is connected to the lower-level power supply VSS, the gate thereof is connected to the gate and drain of the NMOS transistor m4 and the drain thereof is connected to the source of the switching NMOS transistor m2. The drain of the NMOS transistor m2 is connected to the source of the NMOS transistor m3. A laser driving output current is supplied through the drain of the NMOS transistor m3.

In the illustrated embodiment, the current value of the current source 10 will be identified by Io and the mirror ratio of a current mirror circuit made up of the NMOS transistors m4 and m1 will be represented as 1:A. Voltages Vb3 and Vb4 are applied to the gates of the NMOS transistors m10 and m11, respectively.

Hereinafter, it will be described how this laser driver operates.

The current Io is supplied from the current source 10 to the input terminal of the current ratio regulator 7 and then branched into two currents with respective values of kIo and (1−k)Io. The shunt ratio k is determined depending on the voltages Vb3 and Vb4 applied to the gates of the NMOS transistors m10 and m11, respectively. Stated otherwise, the shunt ratio k can be adjusted to a desired value by regulating the voltages Vb3 and Vb4. In the first and second current mirror circuits, the current kIo flows through the transistor m7 and the current (1−k)Io flows through the transistor m8.

First, while the control signal SW is at "Low" level, the switching NMOS transistor m2 is OFF and the laser driver enters the output-disabled state. In the current path selector 6, the transistor m6 turns ON, but the transistor m5 turns OFF. Accordingly, the current (1−k)Io, which flows through the transistor m8 of the first current mirror circuit 9, passes through the transistor m6. On the other hand, the current kIo, which flows through the transistor m7 of the second current mirror circuit 8, is supplied to the NMOS transistor m4. The total amount of current supplied to the NMOS transistor m4 is equal to kIo. Then, the NMOS transistor m4 converts the current supplied into a voltage. As a result, the gate of the output-current-generating NMOS transistor m1 is biased with the voltage.

Next, when the control signal SW rises to "High" level, the switching NMOS transistor m2 turns ON and the laser driver enters the output-enabled state. As a result, the laser driving output current rises steeply. This is because the gate of the NMOS transistor m1 is always biased even in the output-disabled state. In this situation, the PMOS transistor m6 is cut off and the current (1−k)Io, which flows through the transistor m8 of the first current mirror circuit 9, is supplied to the transistor m5. Accordingly, the total amount of current supplied to the drain of the NMOS transistor m4 gets equal to Io. As a result, the gate voltage of the NMOS transistor m1 steeply increases and the transistor m1 can rapidly transition from a linear to saturated region.

As can be seen, by regulating the voltages Vb3 and Vb4 applied to the gates of the NMOS transistors m10 and m11 of the current ratio regulator 7, the current ratio k is easily controllable according to the sixth embodiment. Therefore, the current ratio k can be controlled in such a manner as to optimize the eye pattern of the optical output power under any operating condition, thus realizing a laser driver with broadened applicability.

According to the sixth embodiment, the total number of components required increases but the number of cascaded transistors decreases compared to the fifth embodiment. Thus, the laser driver of the sixth embodiment is operable stably even with a lower voltage applied.

EMBODIMENT 7

Figure 10:
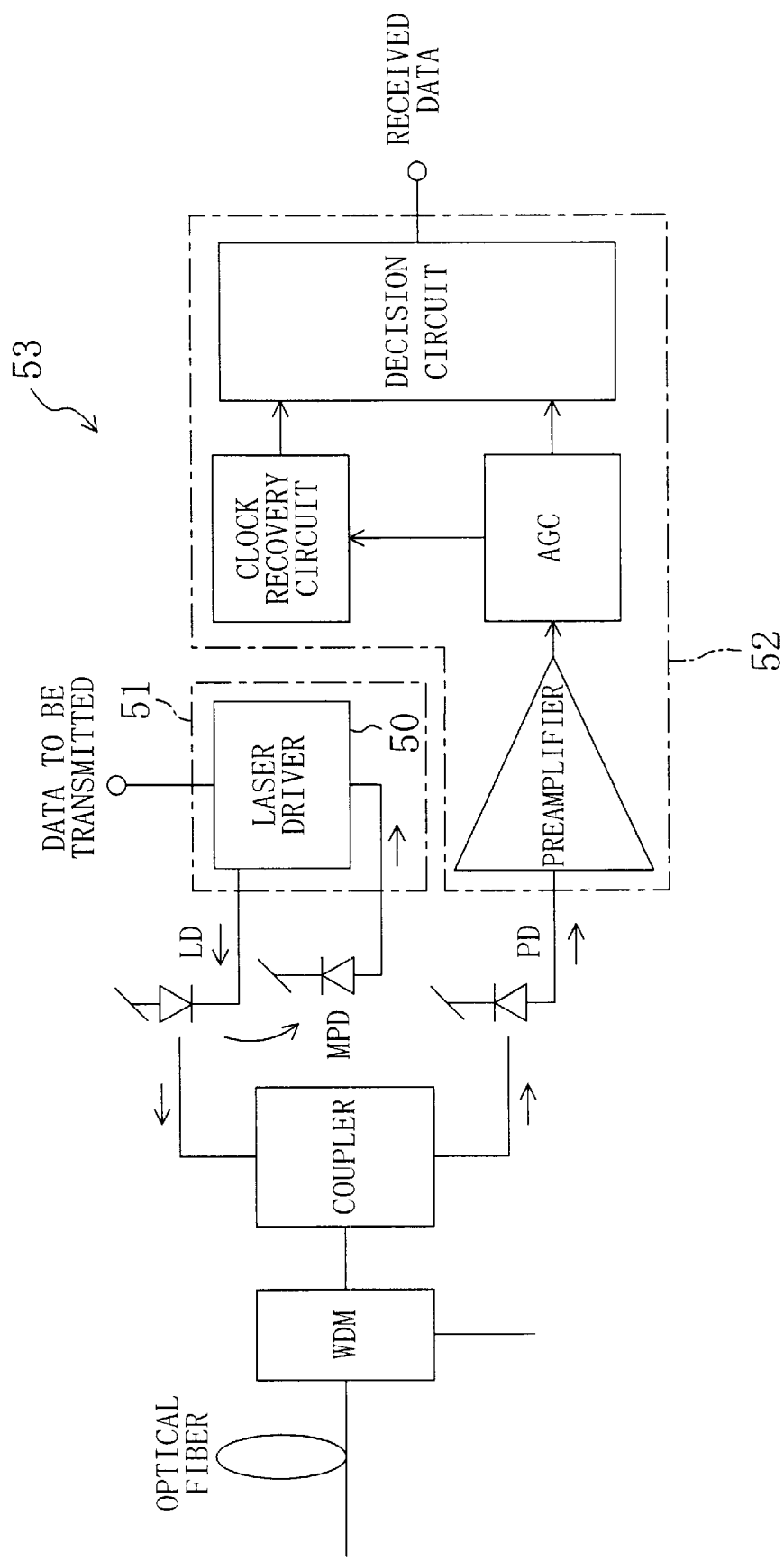
FIG. 10 illustrates an arrangement of an optical transceiver according to a seventh embodiment of the present invention.
Figure 11B:
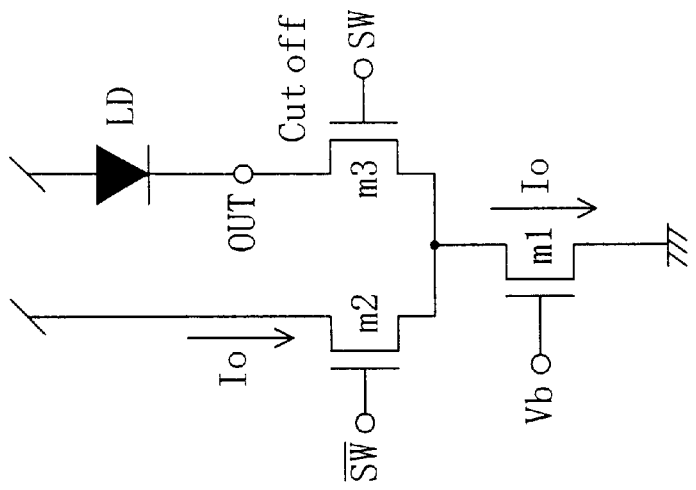
FIGS. 11(a) and 11(b) illustrate a conventional laser driver with a differential configuration in the output-enabled and disabled states, respectively.
Figure 11A:
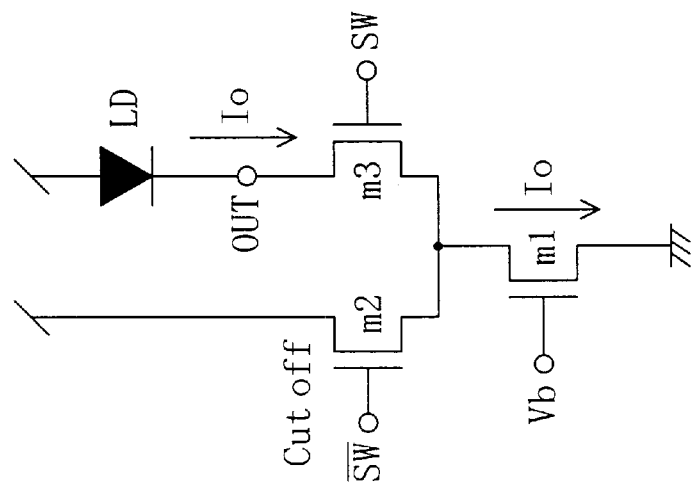
Figure 12A:
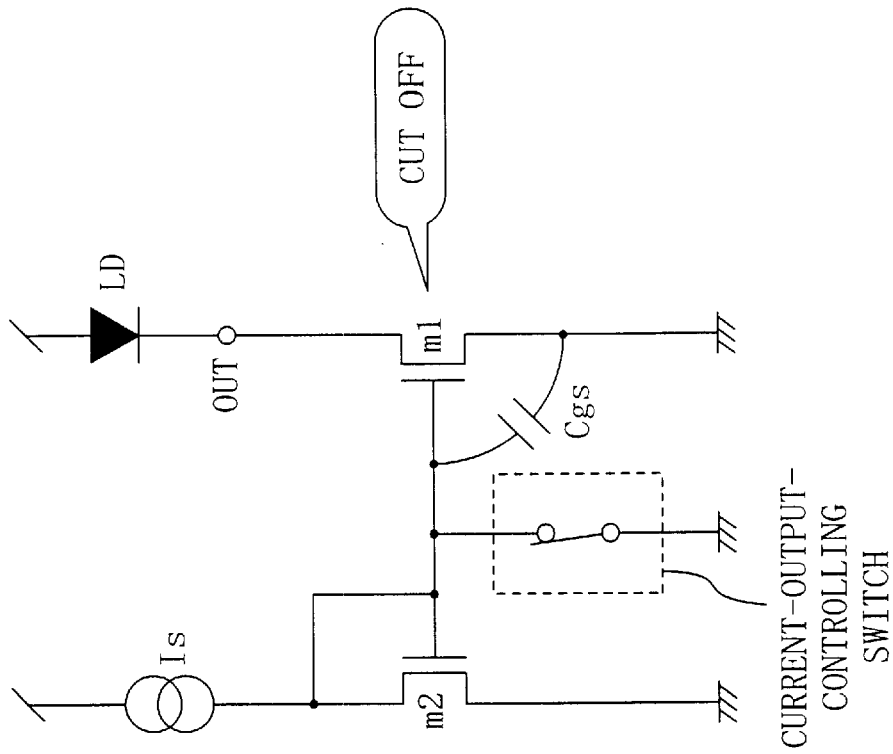
FIGS. 12(a) and 12(b) illustrate a conventional laser driver with a single drive configuration in the output-enabled and disabled states, respectively.
Figure 12B:
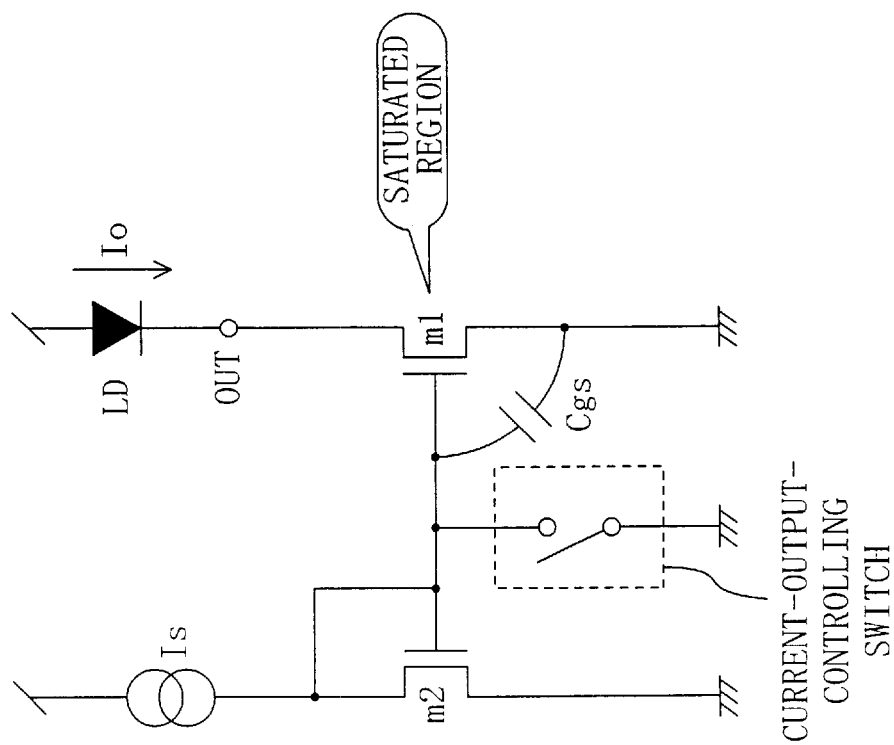

FIG. 10 illustrates an exemplary configuration for an optical transceiver according to a seventh embodiment of the present invention. The optical transceiver 53 shown in FIG. 10 includes: a transmitter section 51 for converting data to be transmitted into laser light by driving a laser diode LD and then transmitting the laser light; and a receiver section 52 for converting the laser light received into received data. The transmitter section 51 includes the laser driver 50 according any of the foregoing embodiments of the present invention and transmits the data by driving the laser diode LD using the laser driver 50.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A laser driver comprising:
   an output node for outputting a driving current therethrough;
   a first power supply node receiving a first supply voltage;
   a first switch connected between the output node and the first power supply node;
   current generating means for generating a first current with a first current value while the first switch is OFF and a second current with a second current value while the first switch is ON, the second current value being different from the first current value;
   current-to-voltage converting means for converting the current supplied from the current generating means into a voltage corresponding to the current value thereof; and
   an output-current-generating transistor, which is connected between the first switch and the first power supply node and receives the voltage from the current-to-voltage converting means at the gate thereof.

2. The laser driver of claim 1, wherein the current generating means comprises:
   a first current source for supplying the first current to the current-to-voltage converting means;
   a second current source for generating a third current with a current value representing a difference between the first and second current values; and
   a current path selector for supplying the third current from the second current source to the current-to-voltage converting means only when the first switch is ON.

3. The laser driver of claim 2, wherein the current path selector comprises:
   an input terminal receiving the third current from the second current source;
   a first output terminal connected to the first power supply node;
   a second output terminal connected to the current-to-voltage converting means;
   a first transistor, of which the source and drain are connected to the input terminal and the first output terminal, respectively, and which turns OFF when the first switch is ON and turns ON when the first switch is OFF; and
   a second transistor, of which the source and drain are connected to the input terminal and the second output terminal, respectively, and which turns ON when the first switch is ON and turns OFF when the first switch is OFF.

4. The laser driver of claim 2, wherein the current path selector comprises:
an input terminal receiving the third current from the second current source;
an output terminal connected to the current-to-voltage converting means; and
a second switch, which is connected between the input and output terminals, turns ON when the first switch is ON and turns OFF when the first switch is OFF.

5. The laser driver of claim 1, wherein the current generating means comprises:
a current source for generating the second current; and
a current shunt circuit supplying the second current from the current source to the current-to-voltage converting means when the first switch is ON, the current shunt circuit branching the second current into the first current and a third current and then supplying the first current to the current-to-voltage converting means when the first switch is OFF, the third current having a current value representing a difference between the first and second current values.

6. The laser driver of claim 5, wherein the second current value is larger than the first current value.

7. The laser driver of claim 5, wherein the current shunt circuit comprises:
an input terminal receiving the second current from the current source;
a first output terminal connected to the first power supply node;
a second output terminal connected to the current-to-voltage converting means;
a first transistor, of which the source and drain are connected to the input terminal and the first output terminal, respectively, and which turns OFF when the first switch is ON and makes the third current flow between the source and drain thereof when the first switch is OFF; and
a second transistor, of which the source and drain are connected to the input terminal and the second output terminal, respectively, and which makes the second current flow between the source and drain thereof when the first switch is ON and makes the first current flow between the source and drain thereof when the first switch is OFF.

8. The laser driver of claim 1, wherein the current generating means comprises:
a first current source for supplying the first current to the current-to-voltage converting means; and
a second current source for supplying a third current with a current value representing a difference between the first and second current values to the current-to-voltage converting means only when the first switch is ON.

9. The laser driver of claim 1, wherein the first switch comprises:
a gate-grounded transistor receiving a constant voltage at the gate thereof; and
a switching transistor connected between the source of the gate-grounded transistor and the output-current-generating transistor.

10. The laser driver of claim 1, wherein the current-to-voltage converting means comprises a transistor, of which the gate and drain are connected together.

11. The laser driver of claim 1, wherein the current generating means comprises:
a current source for generating the second current;
a current ratio regulator for branching the second current supplied from the current source into two currents with a desired current ratio and supplying one of these two currents as the first current to the current-to-voltage converting means; and
a current path selector for supplying the other one of the two currents that have been branched by the current ratio regulator to the current-to-voltage converting means only when the first switch is ON.

12. The laser driver of claim 11, wherein the current ratio regulator comprises:
an input terminal receiving the second current from the current source;
a first output terminal connected to the current path selector;
a second output terminal connected to the current-to-voltage converting means;
a first transistor, of which the source and drain are connected to the input terminal and the first output terminal, respectively, and which receives a first voltage at the gate thereof; and
a second transistor, of which the source and drain are connected to the input terminal and the second output terminal, respectively, and which receives a second voltage at the gate thereof.

13. The laser driver of claim 12, wherein the first or second voltage has its level regulated based on the current value of the second current.

14. The laser driver of claim 1, wherein the current generating means comprises:
a current source for generating the second current;
a current ratio regulator for branching the second current supplied from the current source into two currents with a desired current ratio;
a first current mirror circuit receiving one of the two currents branched by the current ratio regulator as an input current;
a second current mirror circuit receiving the other one of the two currents branched by the current ratio regulator as an input current and supplying an output current as the first current to the current-to-voltage converting means; and
a current path selector for supplying the output current of the first current mirror circuit to the current-to-voltage converting means only when the first switch is ON.

15. The laser driver of claim 14, wherein the current ratio regulator comprises:
an input terminal receiving the second current from the current source;
a first output terminal connected to the first current mirror circuit;
a second output terminal connected to the second current mirror circuit;
a first transistor, of which the source and drain are connected to the input terminal and the first output terminal, respectively, and which receives the first voltage at the gate thereof; and
a second transistor, of which the source and drain are connected to the input terminal and the second output terminal, respectively, and which receives the second voltage at the gate thereof.

16. The laser driver of claim 15, wherein the first or second voltage has its level regulated based on the current value of the second current.

17. The laser driver of claim 1, wherein both the first current value and the second current value are not equal to zero.

18. An optical transceiver for establishing optical communication, comprising:

a transmitter section for converting data to be transmitted into laser light by driving a laser diode and then transmitting the laser light; and a receiver section for converting the laser light received into received data, wherein the transmitter section includes the laser driver as recited in claim 1 and drives the laser diode using the laser driver.

19. A laser driver comprising:

an output node for outputting a driving current therethrough;

a first power supply node receiving a first supply voltage;

a gate-grounded transistor, which is connected between the output node and the first power supply node and receives a constant voltage at the gate thereof;

a switching transistor connected between the source of the gate-grounded transistor and the first power supply node in series to the gate-grounded transistor; and an output-current-generating transistor, which is connected between the switching transistor and the first power supply node in series to the switching transistor, receives a first voltage at the gate thereof when the switching transistor is ON, and receives a second voltage at the gate thereof when the switching transistor is OFF, the second voltage being different from the first voltage.

* * * * *